United States Patent
Jenny et al.

(10) Patent No.: US 9,059,118 B2
(45) Date of Patent: Jun. 16, 2015

(54) METHOD FOR PRODUCING SEMI-INSULATING RESISTIVITY IN HIGH PURITY SILICON CARBIDE CRYSTALS

(75) Inventors: Jason Ronald Jenny, Wake Forest, NC (US); David Phillip Malta, Raleigh, NC (US); Hudson McDonald Hobgood, Pittsboro, NC (US); Stephan Mueller, Troy, NY (US); Valeri F. Tsvetkov, Gasburg, VA (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 12/490,615

(22) Filed: Jun. 24, 2009

(65) Prior Publication Data

US 2009/0256162 A1  Oct. 15, 2009

Related U.S. Application Data

(60) Continuation of application No. 10/842,749, filed on May 11, 2004, now abandoned, which is a division of application No. 10/064,232, filed on Jun. 24, 2002, now Pat. No. 6,814,801.

(51) Int. Cl.
   C30B 29/36    (2006.01)
   H01L 21/324   (2006.01)
   C30B 33/00    (2006.01)

(52) U.S. Cl.
   CPC .............. *H01L 21/324* (2013.01); *C30B 33/00* (2013.01)

(58) Field of Classification Search
   USPC .................................... 117/2, 3, 95
   See application file for complete search history.

(56) References Cited

U.S. PATENT DOCUMENTS

| | | |
|---|---|---|
| 3,615,930 A | 10/1971 | Knippenber et al. |
| 4,866,005 A | 9/1989 | Davis |
| 5,119,540 A | 6/1992 | Kong et al. |
| 5,151,384 A | 9/1992 | Williams |
| RE34,861 E | 2/1995 | Davis et al. |
| 5,611,955 A | 3/1997 | Barrett et al. |
| 5,679,153 A | 10/1997 | Dmitriev et al. |
| 5,709,745 A | 1/1998 | Larkin et al. |
| 5,718,760 A | 2/1998 | Carter et al. |

(Continued)

FOREIGN PATENT DOCUMENTS

| | | |
|---|---|---|
| CN | 1663033 A | 8/2005 |
| CN | 200580021074.2 | 5/2007 |

(Continued)

OTHER PUBLICATIONS

Japanese Patent Office, Official Action, Jan. 8, 2010, issued in Japanese Patent Application No. 2004-515747.

(Continued)

*Primary Examiner* — Robert M Kunemund
(74) *Attorney, Agent, or Firm* — Steven B. Phillips; Moore & Van Allen PLLC (57) ABSTRACT

A method is disclosed for producing high quality semi-insulating silicon carbide crystals in the absence of relevant amounts of deep level trapping elements. The invention includes the steps of heating a silicon carbide crystal having a first concentration of point defects to a temperature that thermodynamically increases the number of point defects and resulting states in the crystal, and then cooling the heated crystal at a sufficiently rapid rate to maintain an increased concentration of point defects in the cooled crystal.

5 Claims, 3 Drawing Sheets

Time

(56) References Cited

U.S. PATENT DOCUMENTS

| | | | |
|---|---|---|---|
| 5,873,937 | A | 2/1999 | Hopkins et al. |
| 5,985,026 | A | 11/1999 | Volkl et al. |
| 6,086,672 | A | 7/2000 | Hunter |
| 6,113,451 | A | 9/2000 | Hobart et al. |
| 6,200,917 | B1 | 3/2001 | Carter et al. |
| 6,201,342 | B1 | 3/2001 | Hobart et al. |
| 6,218,680 | B1 | 4/2001 | Carter, Jr. et al. |
| 6,396,080 | B2 | 5/2002 | Carter |
| 6,403,982 | B2 | 6/2002 | Carter |
| 6,428,621 | B1 | 8/2002 | Vodakov et al. |
| 6,446,180 | B2 | 9/2002 | Li et al. |
| 6,451,112 | B1 | 9/2002 | Hara et al. |
| 6,480,033 | B1 | 11/2002 | Shinozaki |
| 6,497,764 | B2 | 12/2002 | Kuhn et al. |
| 6,507,046 | B2 | 1/2003 | Mueller |
| 6,639,247 | B2 | 10/2003 | Carter, Jr. et al. |
| 6,723,166 | B2 | 4/2004 | Kuhn et al. |
| 6,786,969 | B2 | 9/2004 | Kondo et al. |
| 6,801,989 | B2 | 10/2004 | Johnson et al. |
| 6,803,826 | B2 | 10/2004 | Gomm et al. |
| 6,814,801 | B2 | 11/2004 | Jenny et al. |
| 6,824,611 | B1 | 11/2004 | Kordina et al. |
| 7,135,074 | B2 | 11/2006 | Gunjishima et al. |
| 7,147,715 | B2 | 12/2006 | Malta et al. |
| 7,220,313 | B2 | 5/2007 | Fechko, Jr. et al. |
| 7,300,519 | B2 | 11/2007 | Tsvetkov et al. |
| 7,316,747 | B2 | 1/2008 | Jenny et al. |
| 7,323,051 | B2 | 1/2008 | Hobgood et al. |
| 7,351,286 | B2 | 4/2008 | Leonard et al. |
| 7,361,222 | B2 | 4/2008 | Janzen et al. |
| 7,601,441 | B2 | 10/2009 | Jenny et al. |
| 2001/0017374 | A1 | 8/2001 | Carter et al. |
| 2001/0019132 | A1 | 9/2001 | Carter et al. |
| 2002/0083892 | A1 | 7/2002 | Kondo et al. |
| 2002/0167010 | A1 | 11/2002 | Mueller |
| 2002/0189536 | A1 | 12/2002 | Otsuki et al. |
| 2003/0233975 | A1 | 12/2003 | Jenny et al. |
| 2004/0050320 | A1 | 3/2004 | Maruyama et al. |
| 2004/0119063 | A1 | 6/2004 | Guo et al. |
| 2004/0201024 | A1 | 10/2004 | Tsvetkov et al. |
| 2004/0206298 | A1 | 10/2004 | Jenny et al. |
| 2004/0227165 | A1 | 11/2004 | Wang et al. |
| 2005/0000406 | A1 | 1/2005 | Janzen et al. |
| 2005/0022724 | A1 | 2/2005 | Malta et al. |
| 2005/0022727 | A1 | 2/2005 | Fechko, Jr. et al. |
| 2005/0126471 | A1 | 6/2005 | Jenny et al. |
| 2006/0102068 | A1 | 5/2006 | Tsvetkov et al. |
| 2006/0107890 | A1 | 5/2006 | Hobgood et al. |
| 2006/0213430 | A1 | 9/2006 | Jenny et al. |
| 2007/0240630 | A1 | 10/2007 | Leonard et al. |
| 2007/0240633 | A1 | 10/2007 | Leonard et al. |
| 2009/0256162 | A1 | 10/2009 | Jenny et al. |

FOREIGN PATENT DOCUMENTS

| | | |
|---|---|---|
| EP | 0561462 A2 | 9/1993 |
| EP | 1160361 A1 | 12/2001 |
| EP | 1249521 A1 | 10/2002 |
| EP | 1378591 A1 | 1/2004 |
| EP | 1516361 B1 | 3/2009 |
| EP | 2182100 A2 | 5/2010 |
| JP | 64-073000 | 3/1989 |
| JP | 01073000 A | 3/1989 |
| JP | 08208380 A | 8/1996 |
| JP | H09110584 A | 4/1997 |
| JP | 1160391 A | 3/1999 |
| JP | 11-171691 | 6/1999 |
| JP | 2001-139394 | 5/2001 |
| JP | 2001139394 | 5/2001 |
| JP | 2001-509768 A | 7/2001 |
| JP | 2001-518706 A | 10/2001 |
| JP | 2002060297 A | 2/2002 |
| JP | 2002308699 A | 10/2002 |
| JP | 2003002794 A | 1/2003 |
| JP | 2003500321 A | 1/2003 |
| JP | 2003119098 A | 4/2003 |
| JP | 2003-137694 | 5/2003 |
| JP | 2003226600 A | 8/2003 |
| JP | 2004161604 A | 6/2004 |
| JP | 2004161604 A | 10/2004 |
| JP | 2008504203 A | 2/2008 |
| JP | 2008515748 A | 5/2008 |
| KR | 1020070028589 A | 12/2007 |
| TW | 091100460 | 2/2004 |
| TW | 092109202 | 3/2004 |
| TW | 092117217 | 5/2004 |
| TW | 200624611 | 7/2006 |
| TW | 1285404 | 8/2007 |
| WO | 99/17345 A1 | 4/1999 |
| WO | 0071787 A2 | 11/2000 |
| WO | 02092886 A1 | 11/2002 |
| WO | 02097173 A2 | 12/2002 |
| WO | 04001836 A1 | 12/2003 |
| WO | 2006011976 A1 | 2/2006 |
| WO | 2006041659 A2 | 4/2006 |

OTHER PUBLICATIONS

S.K. Lilov; Determination of native defect concentrations and deviation from stoichiometry in silicon carbide; Materials Science & Engineering; Apr. 15, 1993; pp. 226-229; vol. B18, No. 3; Switzerland.

Yoh-Ichi Yamaguchi et al.; Properties of heteroepitaxial 3C-SiC films grown by LPCVD; Sensors and Actuators A; Jun. 1, 1996; pp. 695-699, vol. 54, No. 1-3; Elsevier Sequoia S.A.; Lausanne, CH.

A. Ellison et al.; HTCVD growth of semi-insulating 4H-SiC crystals with low defect density; Silicon Carbide-Materials, Processing and Devices Symposium (Materials Research Society Symposium Proceedings vol. 640) Silicon Carbide-Materials, Processing and Devices Symposium, Boston, MA, USA, Nov. 27-29, 2000, 2001 Warrendale, PA, USA, Mater. Res. Soc., USA, pp. H1.2.1-H1.2.11.

Viktor V. Zelenin et al.; Growth and investigation of epitaxial 6H-SiC layers obtained by CVD on Lely-grown substrates; Materials Science and Engineering B; Apr. 1, 1997; pp. 300-303; vol. 46, No. 1-3; Elsevier Sequoia, Lausanne, CH.

Svitlana I. Vlaskina et al.; 6H to 3C Polytype Transformation in Silicon Carbide; Japanese Journal of Applied Physics, Part 2 (Letters); Jan. 15, 1999; pp. L27-L29; vol. 38, No. 1A-B; Publication Office, Japanese Journal Appl. Phys.; Japan.

Stephan G. Mueller et al.; The status of SiC bulk growth from an industrial point of view; Journal of Crystal Growth 211 (2000); pp. 325-332; 2000 Elsevier Science B.V.

B. Magnusson et al.; Infrared absorption and annealing behavior of semi-insulating 4H SiC HTCVD substrates; Mat. Res. Soc. Symp. Proc.; vol. 680E; pp. E5.11.1-E5.11.6; 2001 Materials Research Society.

Search Report ROC (Taiwan) Patent Application No. 092117120, search date of completion Mar. 10, 2007; pp. 2.

Cree Inc., English Translation of Japanese Patent Office, Office Action, Date of Dispatch: Jun. 23, 2010, for Japanese Patent Application No. 2004-515747.

Cree Inc., English Translation of Korea Patent Office, Office Action, Mailing Date: Jul. 26, 2010, for Korea Patent Application No. 10-2004-7019323.

Cree, Inc., Chinese Patent Application No. 201010257230.8, English translation of Office Action dated Sep. 5, 2011, 10 pages.

Cree, Inc., Japanese Application No. 2007-518105, Final Decision of Rejection dated Sep. 4, 2012.

Cree, Inc., Chinese Application No. 201010257230.8, Office Action dated Aug. 2, 2012.

Cree, Inc., Japanese Patent Application No. 2007-518105, Office Action dated Aug. 11, 2011, 5 pages.

Bakin, et al., "State of the Art in Defect Control of Bulk SiC", 1998 High Temperature Electronic Materials, Devices and Sensors Conference (1998).

Dmitriev, et al, "Large Area Silicon Carbide Devices Fabricated on SiC Wafers with Reduced Micropipe Density", Materials Science and Engineering, B61-62:446-449 (1999).

(56) References Cited

OTHER PUBLICATIONS

Ivanov, et al., "Nitrogen Doping Concentration as determined by Photoluminescence in 4H- and 6H-SiC", Journal of Applied Physics, 80(6):3504-3508 (1996).
Kuhr, et al., "Hexagonal Voids and the Formation of Micropipes During SiC Sublimation Growth", J. Appl. Phys., 89 (8):4625-4630 (2001).
Lilov, et al., "Studies of Growth Processing Silicon Carbide Epitaxial Layers from the Vapour Phase", Journal of Crystal Growth, 32:170-178 (1976).
Muller, et al, "Progress in the Industrial Production of SiC Substrates for Semiconductor Devices", Materials Science and Engineering, pp. 327-331 (Mar. 22, 2001).
Powell, "Growth of Low Micropipe Density SiC Wafers", Materials Science Forum 338-340:437-440 (2000).
Rabeck, et al., "Thermodynamic Considerations of the Role of Hydrogen in Sublimation growth", Journal of the Electrochemical Society, 144:1024-1027 (1997).
Sanchez, et al, "Formation of Thermal Decomposition Cavities in Physical Vapor Transport of Silicon Carbide", 29 (3):347-352 (2000).
ASTM International Test No. F978-02, "Standard Test Method for Characterizing Semiconductor Deep Levels by Transient Capacitance Techniques".
SIMS Theory—Sensitivity and Detection Limits, Charles Evans & Associates (1995), http://www.eaglabs.com/training/tutorials/sims_theory_tutorial/limits.php.
Cree, Inc., Office Action, dated Apr. 25, 2008 for European Patent Application No. 03736939.4.
Cree, Inc., Response to Office Action, dated Aug. 21, 2008, filed for European Patent Application No. 03736939.4.
Cree, Inc., English Translation of Patent Office of the People's Republic of China Office Action, dated Oct. 27, 2006, for Chinese Patent Application No. 03814624.X.
Cree, Inc., Response to Patent Office of the People's Republic of China Office Action, dated May 11, 2007, for Chinese Patent Application No. 03814624.X.
Cree, Inc., English Translation of Patent Office of the People's Republic of China Office Action, dated Dec. 5, 2008 for Chinese Patent Application No. 200580021074.2.
Cree, Inc., Response to Patent Office of the People's Republic of China Office Action, dated Jun. 22, 2009 for Chinese Patent Application No. 200580021074.2.
Cree, Inc., English Translation of Patent Office of the People's Republic of China Decision of Rejection, dated Sep. 25, 2009, for Chinese Patent Application No. 200580021074.2.
Cree, Inc., Patent Office of the People's Republic of China Request for Re-Examination, dated Jan. 11, 2010, for Chinese Patent Application No. 200580021074.2.
Cree, Inc., International Search Report, dated Sep. 4, 2003, for International Patent Application No. PCT/US03/18068.
Cree, Inc., Response to Written Opinion, dated Jun. 2, 2004, for International Patent Application No. PCT/US03/18068.
Cree, Inc., International Preliminary Examination Report, dated Jul. 15, 2004, for International Patent Application No. PCT/US03/18068.
Cree, Inc., International Search Report, dated Sep. 9, 2005, for International Patent Application No. PCT/US05/20718.
Cree, Inc., International Preliminary Report on Patentability, dated Jul. 4, 2006, for International Patent Application No. PCT/US05/20718.
Cree, Inc., European Patent Office Office Action, dated Jul. 23, 2007, for European Patent Application No. 05760208.8.
Cree, Inc., Response to European Patent Office Office Action, dated Jan. 25, 2008, for European Patent Application No. 05760208.8.
Cree, Inc., European Patent Office Summons to Attend Oral Proceedings, dated Nov. 26, 2009, for European Patent Application No. 05760208.8.
Cree Inc., English Translation of Response to Office Action, dated Jun. 2, 2010, for Japanese Patent Application No. 2004-515747.
Cree, Inc., English translation of Taiwan Intellectual Property Office, Office Action, dated Mar. 27, 2008, for Taiwanese Patent Application No. 094121084.
Cree, Inc., English translation of Response to Office Action dated Aug. 2007, for Taiwanese Patent Application No. 094121084.
Cree, Inc., English translation of Taiwan Intellectual Property Office Examination Report, dated Apr. 17, 2007, for Taiwanese Patent Application No. 094121084.
Cree, Inc., Reexamination Application and Brief, dated Dec. 3, 2008, for Taiwanese Patent Application No. 094121084.
Cree, Inc., English translation of Taiwan Intellectual Property Office, Office Action, dated Aug. 24, 2009, for Taiwanese Patent Application No. 094121084.
Cree, Inc., English translation of Response to Office Action, dated Feb. 12, 2010, for Taiwanese Patent Application No. 094121084.
Cree, Inc., English translation of Taiwan Intellectual Property Office, Office Action dated Mar. 22, 2010, for Taiwanese Patent Application No. 094121084.
Cree, Inc., Japanese Patent Application No. 2004-515747, English translation of Office Action dated Aug. 10, 2010, 2 pages.
Cree, Inc., Japanese Patent Application No. 2004-515747, English translation of Response to Office Action dated Jul. 22, 2010, 4 pages.
Cree, Inc., English translation of South Korea Request Examination for South Korea Patent Application No. 10-2004-7019323, dated May 15, 2008, 3 pages.
Cree, Inc., Patent Cooperation Treaty International Search Report for International Patent Application No. PCT/US05/020718, date of mailing Sep. 13, 2005, 3 pages.
Cree, Inc., Patent Cooperation Treaty Written Opinion for International Patent Application No. PCT/US05/020718, 5 pages.
Cree, Inc., Taiwan Office Action for Taiwan Patent Application No. 094121084, issuance dated Apr. 19, 2007, 4 pages.
Cree, Inc., English translation of Taiwan Response to Office Action for Taiwan Patent Application No. 094121084, filed Jun. 2010, 6 pages.
Search Report for ROC (Taiwan) Patent Application No. 094121084; Search Completion Date Apr. 14, 2007, 1 page.
Cree, Inc., Korean Application No. 10-2007-7001899, Office Action dated Apr. 25, 2012.
Cree, Inc., Chinese Application No. 201010257230.8, Third Office Action, Feb. 5, 2013.
Cree, Inc., Japanese Application No. 2011-047944, Office Action, Dec. 3, 2012.
Cree, Inc., European Application No. 101857480.0, Extended European Search Report, Jul. 31, 2013.
Cree, Inc., European Application No. 10185756.3, Extended European Search Report, Aug. 5, 2013.
Cree, Inc., European Application No. 10185753.0, Extended European Search Report, Aug. 5, 2013.
Yakimova, R., et al., Current status and advances in the growth of SiC, Diamond and Related Materials, 2000, pp. 432-438, vol. 9.
Herro, Z.G., et al., Effective increase of single-crystalline yield during PVT growth of SiC by tailoring of temperature gradient, Journal of Crystal Growth, 2004, pp. 105-112, vol. 262.
Cree, Inc., Japanese Application No. 2007-518105, Office Action, Aug. 26, 2013.
Ohtani, N., et al., Comparative Study of Sic Bulk Crystal Growth Parallel and Perpendicular to the <0001. c-axis, FED Journal, 2000, pp. 16-23, vol. 11, No. 2.
Cree, Inc., Korean Application No. 10-2013-7001166, Office Action, May 20, 2013.
Cree, Inc., European Application No. 10154952.5, Office Action, Aug. 19, 2014.
Cree, Inc., European Application No. 10185748.0, Office Action, Aug. 19, 2014.
Cree, Inc., European Application No. 10185756.3, Office Action, Aug. 20, 2014.
Cree, Inc., European Application No. 10185753.0, Office Action, Aug. 19, 2014.
Cree, Inc., Korean Application No. 10-2007-7001899, Trial Case No. 2012 Won 10626, Trial Decision, Oct. 23, 2014.
Cree, Inc., Japanese Application No. 2011-047944, Decision of Rejection, Dec. 11, 2013.

(56) References Cited

OTHER PUBLICATIONS

European Patent Office, European Patent Application No. 10185756.3, Office Action dated Jan. 22, 2015, 4 pages.

European Patent Office, European Patent Application No. 10185748.0, Office Action dated Nov. 12, 2014, 3 pages.

Chinese Patent Office, Chinese Patent Application No. 201210395316.8, Office Action dated Nov. 28, 2014, 10 pages.

Japanese Patent Office; Japanese Office Action for Application No. 2014-081866 dated Feb. 10, 2015.

Japanese Patent Office; Japanese Office Action for Application No. 2011-47944 dated Mar. 27, 2015.

European Patent Office; European Office Action for Application No. 10185748.0 dated Apr. 15, 2015.

Figure 3 derive their semi-insulating properties from the presence of intrinsic (point defect related) deep electronic states lying near the middle of the silicon carbide bandgap. The intrinsic deep states generally arise during growth of a crystal boule at high temperatures from which substrate wafers are cut in a manner generally well understood in this art.

METHOD FOR PRODUCING SEMI-INSULATING RESISTIVITY IN HIGH PURITY SILICON CARBIDE CRYSTALS

This is a continuation of Ser. No. 10/842,749 filed May 11, 2004. Ser. No. 10/842,749 is a divisional application of Ser. No. 10/064,232 filed Jun. 24, 2002, and now U.S. Pat. No. 6,814,801.

BACKGROUND

The present invention relates to the inventions set forth in commonly assigned U.S. Pat. No. 6,218,680 ("the '680 patent"); U.S. Pat. Nos. 6,396,080; 6,403,982; 6,639,247; and 6,507,046.

The present invention relates to semi-insulating silicon carbide single crystals, and in particular, relates to a method of forming high purity semi-insulating silicon carbide single crystal substrates that have intrinsic point defects and resulting deep level electronic states in an amount greater than the net concentration of any compensating shallow dopants (i.e., an amount greater than the uncompensated shallow dopants), and to maintain the semi-insulating quality of the silicon carbide substrate during additional process steps of device manufacture.

As set forth in the '680 and related patents, it has been discovered that semi-insulating silicon carbide can be produced without the use of vanadium as the dopant to create deep level states that produce the semi-insulating character.

Although vanadium can produce a semi-insulating silicon carbide crystal, its presence has been observed to create a back-gating effect; i.e., the trapped negative charge on the vanadium acts as a grown-in gate in devices in which a vanadium-doped crystal is used as the semi-insulating substrate. Thus, for a number of device considerations, vanadium is best avoided.

In the '680 patent and the related applications, a semi-insulating silicon carbide crystal is described that includes donor dopants, acceptor dopants and intrinsic point defects that produce deep level states. When the concentration of intrinsic point defects exceeds the difference between the concentration of donors and the concentration of acceptors, the states resulting from intrinsic point defects can provide semi-insulating characteristics in the functional absence of vanadium; i.e., including a minimal presence that is less than the presence that can affect the electronic properties of the crystal.

The requirements for and the advantages of semi-insulating substrates, their use in devices, particularly microwave devices, and the associated and particular requirements for silicon carbide semi-insulating substrates are set forth in detail in the '680 patent and related applications, and are generally well understood in the art from a background standpoint. Thus, they will not be repeated in detail herein. For reference purposes, a relevant discussion is set forth in the '680 patent at column 1, line 14 through column 3, line 33, which is incorporated entirely herein by reference.

To this discussion it should be added, however, that the ever-increasing demand for wireless communication services, including high bandwidth delivery of Internet access and related services, drives a corresponding demand for devices and circuits that can support such delivery, which in turn calls for materials—such as semi-insulating silicon carbide—from which devices having the required capabilities can be manufactured.

Accordingly, the '680 patent explains that superior microwave performance can be achieved by the fabrication of silicon carbide field effect transistors (FETs) and related devices on high purity, vanadium-free semi-insulating monocrystalline silicon carbide substrates. As set forth in the '680 patent, the substrates derive their semi-insulating properties from the presence of intrinsic (point defect related) deep electronic states lying near the middle of the silicon carbide bandgap. The intrinsic deep states generally arise during growth of a crystal boule at high temperatures from which substrate wafers are cut in a manner generally well understood in this art.

In devices that incorporate these substrates, and in order to provide the appropriate low-loss RF performance, the substrate must act as a low-loss dielectric medium by continuously maintaining its semi-insulating characteristics. In turn, the ability to maintain semi-insulating behavior is dependent upon the total number of intrinsic deep states in the substrate. In current practice, if the density of the intrinsic deep levels is not sufficiently high it has been observed in practice that the semi-insulating characteristics of the substrate can become reduced or functionally eliminated when subsequent steps are carried out on or using a semi-insulating silicon carbide wafer. Such steps include the growth of epitaxial layers at temperatures of about (for illustrative purposes) 1400° or above on the semi-insulating silicon carbide wafer. This in turn reduces the number of useful devices that can be formed on or incorporating the wafers.

Although the inventors do not wish to be bound by any particular theory, it appears that when semi-insulating silicon carbide substrate wafers of this type are subjected to process steps at temperatures within certain ranges, the subsequent processing can act as an anneal that reduces the number of point defects. This can be thought of in the positive sense that a higher quality crystal is created, but it is disadvantageous when the number of intrinsic point defects is the basis for the semi-insulating character of the substrate wafer.

Stated differently, if kept within a particular temperature range for a sufficient time, the crystal equilibrium or near-equilibrium will shift to one in which the number of point defects is reduced; i.e., the crystal becomes more ordered (fewer point defects) at lower temperatures than it was at higher temperatures, in a manner expected in accordance with well-understood thermodynamic principles.

Accordingly, a need exists for silicon carbide substrate wafers that incorporate the advantages set forth in the '680 patent, and that can maintain these advantages during subsequent manufacture of devices and circuits on or incorporating the semi-insulating silicon carbide substrate wafers.

SUMMARY

Accordingly, it is an object of the invention to produce semi-insulating resistivity in high purity silicon carbide crystals, and to do so in a manner that results in a silicon carbide crystals that maintain their semi-insulating characteristics during and after subsequent device processing and manufacture.

The invention meets this object with a method of producing high quality semi-insulating silicon carbide crystals in the absence of relevant amounts of deep level trapping elements. The method comprises heating a silicon carbide crystal to a temperature above the temperatures required for CVD growth of silicon carbide from source gases, but less than the temperatures at which disadvantageously high rates of silicon carbide sublimation occur under the ambient conditions to thereby thermodynamically increase the concentration (i.e., number per unit volume) of point defects and resulting states in the crystal; and then cooling the heated crystal to approach room temperature at a sufficiently rapid rate to minimize the time spent in the temperature range in which the defects are sufficiently mobile to disappear or be re-annealed into the crystal to thereby produce a silicon carbide crystal with a concentration of point defect states that is greater than the concentration of point defect states in an otherwise identically grown silicon carbide crystal that has not been heated and cooled in this manner.

In another aspect, the invention is the semi-insulating silicon carbide crystal made by the method of the invention.

In yet another aspect, the invention is a method of producing semiconductor device precursors on semi-insulating substrates. In this aspect the invention comprises heating a silicon carbide substrate wafer to a temperature of at least about 2000° C., then cooling the heated wafer to approach room temperature at a rate of at least about 30° C. per minute, and then depositing an epitaxial layer of a semiconductor material on the substrate wafer.

The foregoing and other objects and advantages of the invention and the manner in which the same are accomplished will become clearer based on the followed detailed description taken in conjunction with the accompanying drawings in which:

DETAILED DESCRIPTION

Although the inventors do not wish to be bound by any particular theory, the nature of the invention can be best understood in a thermodynamic sense. As noted above, one object of the invention is to avoid the use of vanadium to produce semi-insulating character in silicon carbide. Instead, the present invention creates a sufficiently large concentration of point defect states in the silicon carbide so that the concentration remaining after normal semiconductor processing and device manufacture still exceeds the number necessary to produce semi-insulating character.

Those familiar with the nature of silicon carbide and the basis for semi-insulating characteristics will recognize that there is no specific number or concentration of point defects that meets this requirement. Instead, the goal is to minimize the concentration of other dopants (including point defects) in the lattice that could contribute to conductive characteristics, and then exceed that concentration with the concentration of items, in this case point defects and the resulting states they create, that create the desired semi-insulating characteristics.

Stated differently, in a compensated crystal the concentration of point defects that produce the desired deep level states and the resulting semi-insulating characteristics must be greater than the net concentration of the shallow compensating dopants. Thus, a semi-insulating compensated crystal of silicon carbide can have a relatively high concentration of both acceptor and donor atoms, provided that the number of point defects is in excess of the difference between those concentrations. This concentration of point defects can also be expressed as the concentration needed to exceed any uncompensated shallow dopants.

It has been generally found to be more efficient, however, to minimize the number of potentially compensating donor and acceptor atoms and thus minimize the number of point defects required to exceed the relevant numerical difference. For example (and for discussion purposes only), if the concentration of donor atoms were 2E17 ($2\times10^{17}$ cm$^{-3}$) and acceptor atoms 3E17 ($3\times10^{17}$ cm$^{-3}$), the concentration of point defects would have to be greater than 1E17 (i.e. 3E17 minus 2E17). Thus, minimizing the number (concentration) of donor and acceptor atoms is the preferred, although not necessary, manner of carrying out the present invention, because it reduces the number of states that need to be created to produce the semi-insulating character in the crystal.

In its broadest aspect, the invention is a method of producing high quality semi-insulating silicon carbide crystals in the absence of relevant amounts of deep level trapping elements. In this aspect the invention comprises heating a silicon carbide crystal to a temperature above the temperature required for chemical vapor deposition (CVD) growth of silicon carbide from source gases, but less than the temperature at which disadvantageously high rates of silicon carbide sublimation occur under the ambient conditions to thereby thermodynamically increase the concentration of point defects and resulting states in the crystal.

The starting crystals are preferably of high purity and are produced by a seeded sublimation technique such as is set forth in U.S. Pat. No. 34,861 (reissued from U.S. Pat. No. 4,866,005) or as discussed in Mueller, Status of SiC Bulk Growth from an Industrial Point of View, J. Crystal. Growth v. 211 No. 1 (2000) pp 325-332.

The method then comprises cooling the heated crystal to approach room temperature at a sufficiently rapid rate to maintain a concentration of point defects in the cooled crystal that remains greater than the first concentration.

Stated somewhat differently, the method comprises the step of cooling the heated crystal to approach room temperature at a sufficiently rapid rate to reduce the time spent in the temperature range in which the defects—including, but not limited to, those created by the heating step—are sufficiently mobile to be re-annealed into the crystal to thereby produce a silicon carbide crystal with a concentration of point defect-related deep level states that is greater than the concentration of such states in an otherwise identically grown silicon carbide crystal that has not been heated and cooled in this manner.

In the most preferred embodiments, the crystal is heated to a temperature of between about 2,000° C. and 2,400° C. at atmospheric pressure. These temperatures provide a useful range at atmospheric pressure. At temperatures higher than 2400° C. the silicon carbide tends to sublime at undeniably high rates and thus temperatures above 2400° C. are less favored or disadvantageous at atmospheric pressure.

It will be understood by those familiar with the physical properties of silicon carbide that sublimation can occur over a relatively wide range of high temperatures. At lower portions of this range, the rate of sublimation is small enough to be of little or no concern. At higher portions of this range, however, the rate of sublimation will be high enough to be disadvantageous. Accordingly, the upper temperature limit of the method of the invention will to some extent be bounded by the subjective degree of sublimation found to be troublesome in particular circumstances. As noted above, at atmospheric pressure, 2400° C. has been found to be a convenient upper limit, but is not an absolute one.

The purpose of raising the temperature to 2000° C. or greater is a thermodynamic one: in a normally expected fashion, the entropy of the crystal is higher at higher temperatures, and thus, more of the point defects and resulting states that can produce semi-insulating character are present at higher temperatures. Additionally, those familiar with silicon carbide and the thermodynamics of crystals will recognize that as the temperature increases, additional types of states can exist that do not occur at lower temperatures. If the heated crystal is properly cooled in accordance with the present invention, these additional types of states can be preserved and will contribute to the desired semi-insulating properties.

Accordingly, heating the crystals to these temperatures creates a more disordered crystal, and the invention freezes (in a relative sense) these desired states in the crystals as the crystal is returned to room temperature. The cooling step is significant because if the crystal is allowed to spend too much time in intermediate temperature ranges, such as those above about 1400° C., the crystal will undergo the aforementioned annealing process, and can reach a different equilibrium or near-equilibrium condition in which the states disappear (or are functionally reduced to an irrelevant number) as the crystal becomes more ordered.

With respect to the preferred upper limit of 2400° C., it will be understood by those familiar with silicon carbide and crystal growth techniques that this is a practical limitation at atmospheric pressure rather than an absolute one. Stated differently, 2400° C. is a preferred upper temperature when using relatively typical equipment operating at atmospheric pressure. Those having the ordinary skill expected in this field could carry out the heating at higher temperatures without undue experimentation, but would have to add additional equipment and techniques such as incorporating an overlying silicon and carbon atmosphere or using some other high pressure technique to prevent the sublimation of silicon carbide that begins to occur in statistically significant amounts at such higher temperatures.

Thus, the method of the invention heats the crystal to a temperature as high as practical to produce as many states as possible in the crystal while avoiding or minimizing degradation or sublimation of the crystal.

During the heating step, the crystal is preferably maintained at the elevated temperature for a period of at least about two minutes, an interval that has practical and functional considerations. From a practical standpoint, it will take several minutes under most circumstances to heat the silicon carbide crystal to this temperature. From a functional standpoint, this also provides sufficient time for the crystal to reach an equilibrium or near equilibrium condition with respect to the states that are desirably generated. The heating time is presently functionally best expressed as a time sufficient to obtain a thermal equilibrium or near equilibrium in the crystal having the desired number of states. It will be understood that the crystal does not need to reach a full equilibrium in the most proper or restricted sense of that term, but the term is used herein to describe a condition in which the crystal reaches a given temperature and is maintained there for a time sufficient to develop the desired number of states.

The step of heating the crystal preferably comprises heating the crystal in an induction heater, in which case the step of cooling the crystal includes (at least) reducing the power to the induction coil. Induction heaters and their method of operation in semiconductor manufacture are generally well understood in the art and can be incorporated according to the invention without undue experimentation. Thus, as the particular induction heater is not critical to the claimed invention, it will not be discussed in detail otherwise herein. Additionally, other types of heating can be used by those of ordinary skill in this art and without undue experimentation.

Once the crystal has been heated for the desired period of time at the temperature of 2000° C. or above, it is cooled in a manner that avoids dwelling for any significant time period in the temperature range where the defects are mobile enough to disappear or to be re-annealed into the system. In presently preferred embodiments, a rate of cooling in excess of about 30° C. per minute appears to be preferred with a rate of 150° C. per minute appearing to be a useful upper limit.

It will be understood by those familiar with thermodynamics and the heating and cooling of materials, particularly materials at relatively high temperatures, that the rate of cooling need be neither constant nor exact throughout the entire cooling process. Stated differently, while the crystal is cooling, and particularly while it is cooling within temperature ranges where re-annealing can occur at significant rates, the rate of cooling should desirably range between the 30° C. per minute and 150° C. per minute preferred limits. For the usual and well-understood thermodynamic reasons, the heat loss and thus the rate of cooling will tend to be most rapid as the crystal cools from the highest temperatures and will tend to moderate as the crystal approaches and reaches lower temperatures. In particular, once the crystal is cooled below the temperature range in which re-annealing takes place at significant rates, the rate of cooling can become slower without any functional disadvantage. Accordingly, as an individual crystal is cooled, the rate at which it cools can vary within the 30°-150° C. per minute preferred range while still taking advantage of the method of the invention.

A rate of cooling that is too slow allows the crystal to spend too much time in the temperature range at which the states will heal and the crystal become sufficiently ordered to reduce the number of states below the number necessary to retain the semi-insulating characteristics. Alternatively, cooling at an overly-rapid rate can produce mechanical stresses in the crystal including fracturing if the thermal stress is sufficiently great.

In preferred embodiments the cooling step includes both passive and active steps. As a first step, the power to the induction heater is either reduced or turned off entirely. At the relatively high temperatures to which the crystal has been heated, the initial heat loss is a radiation heat loss. As the temperature becomes lower, the mechanisms of conduction and convection cooling take over. Accordingly, to further encourage and control the cooling rate, the heating chamber can be flooded with an inert gas, typically argon. Additionally, the thermal mass of the crystal and of the materials with which it is placed in contact can be used to help control the cooling rate. Consequently, three basic ways to control the rate of cooling include adjusting the power to the induction coil (or to any other relevant heating mechanism well understood in this art such as resistance heating); flowing a cooling gas around and over the silicon carbide crystal; and controlling the thermal mass of the crystal and its surroundings; i.e., such as the use of a heat sink. Because these are thermodynamic conditions, they can be addressed in a number of different ways that are not critical to the claimed invention and can be carried out by those of ordinary skill in this art without undue experimentation.

The preferred cooling rate of between about 30° and 150° C. per minute can be also expressed as cooling the crystal to about room temperature in less than about 70 minutes, or—at a more rapid pace—cooling the crystal to about room temperature in less than about 20 minutes.

Because the invention provides a beneficial semi-insulating silicon carbide crystal, including substrate wafers, the method of the invention can further comprise the steps of heating the silicon carbide substrate wafer to a temperature of about 2,000° C. (and preferably to between 2,000° and 2,400° C.), cooling the heated wafer to approach room temperature at a rate of at least about 30° C. per minute (and preferably approaching 150° C. per minute), and then depositing one or more epitaxial layers of semiconductor material on the substrate wafer. Because the advantage of silicon carbide often (although not exclusively) relates to its wide bandgap properties, in preferred embodiments, the step of depositing the epitaxial layer will comprise depositing an epitaxial layer selected from the group consisting of other wide bandgap semiconductors such as silicon carbide or Group III nitrides using chemical vapor deposition (CVD) techniques. In the case of silicon carbide, the step of depositing the epitaxial layer is typically carried out at temperatures greater than about 1,400° C. As noted above, in prior techniques steps carried out at such temperatures tended to reduce the number of defects to a point at which the substrate would no longer have appropriate semi-insulating characteristics. Because the invention provides a method for controllably increasing the number of point defects and resulting deep level states as compared to "as-grown" crystals, these later processing steps do not spoil the semi-insulating character of the crystal even though some of the defects are expected to heal.

Accordingly, in another aspect, the invention comprises the wafer and epitaxial layer(s) produced by this aspect and embodiment of the invention.

The invention can be carried out on substrate wafers or single crystal boules, with substrates being the preferred embodiment because their large surface-to-volume ratio enables them to cool at the relatively rapid rates that are useful in the invention without suffering undue or catastrophic thermal stress. Other than this practical point, however, there is no conceptual difference between the manner in which the additional states can be created in a wafer versus a boule. Accordingly, the invention can also comprise the steps of heating a silicon carbide boule to a temperature of at least about 2,000° C., then cooling the heated boule to approach room temperature at the rate of at least about 30° C. per minute, then slicing a silicon carbide wafer from the boule and then depositing one or more epitaxial layers of semiconductor material on the sliced wafer.

In an alternative embodiment, the method can comprise the steps of slicing the silicon carbide wafer from the single crystal boule, then heating the sliced wafer to the temperature of at least about 2,000° degrees C. at atmospheric pressure, and then cooling the heated wafer to approach room temperature at a rate of at least 30° C. per minute, and thereafter depositing the epitaxial layer(s) of semiconductor material on the sliced wafer.

As known to those familiar with the preparation of substrate wafers and the growth of epitaxial layers, the sliced silicon carbide wafer is generally not used immediately after having been sliced, but instead is cleaned and polished to prepare a more favorable surface for epitaxial growth. The polishing and cleaning steps for semiconductor materials in general and silicon carbide in particular are well established in this art, can be practiced without undue experimentation, and will not be otherwise discussed in detail herein.

In either case, the invention further comprises the wafer and one or more epitaxial layers, and can further comprise devices that incorporate the wafer and epitaxial layers formed according to the methods of the embodiments of the invention.

The invention is not limited to use with any particular devices, but commonly used microwave devices that incorporate semi-insulating silicon carbide substrates include various types of field effect transistors (FETs), metal oxide semiconductor field effect transistors (MOSFETs), junction field effect transistors (JFETs), metal-semiconductor field effect transistors (MESFETs), heterostructure field effect transistors (HFETs), high electron mobility transistors (HEMTs), and DMOS transistors. Those familiar with semiconductor devices and devices useful for microwave frequency operation will recognize that this list is neither limiting nor exhaustive. It is, however, illustrative of the advantages provided by the invention described and claimed herein.

Figure 1:
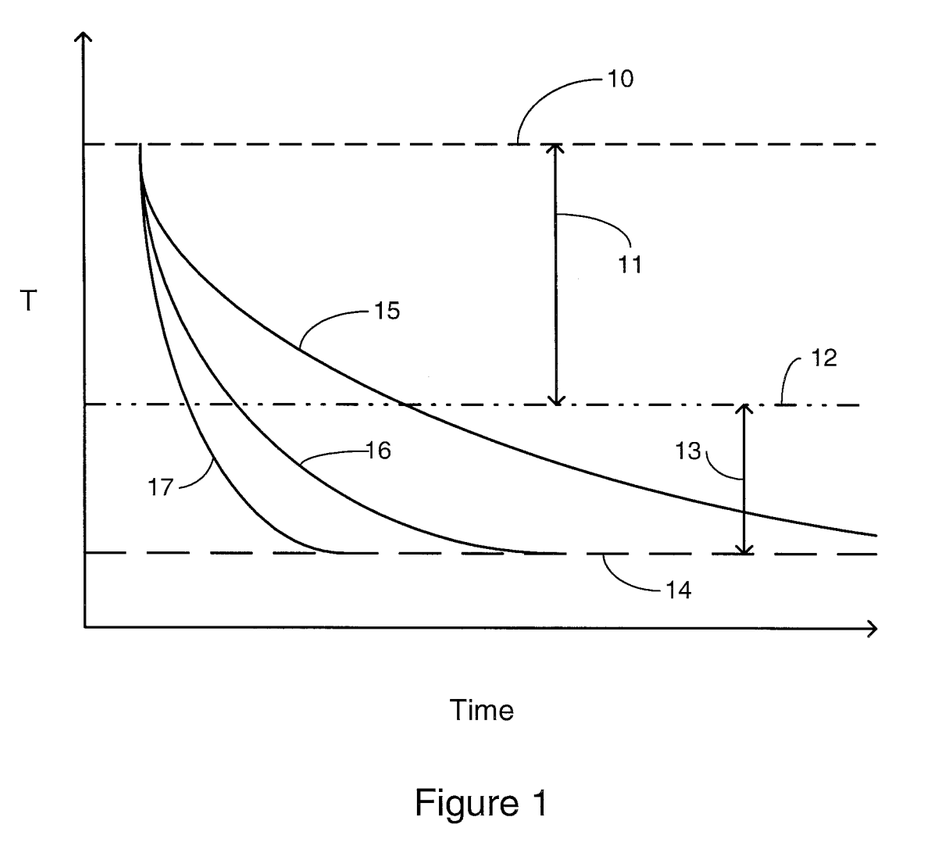
FIG. 1 is a schematic diagram illustrating the temperature ranges referred to in the detailed description and several different cooling rates.

FIG. 1 schematically illustrates the temperature ranges and the cooling rates used in the present invention. Those familiar with these techniques will recognize that FIG. 1 is explanatory in nature rather than an exact representation of particular experiments.

FIG. 1 is a plot of temperature versus time. Three general sets of temperatures are characterized. The uppermost line designated at 10 represents the temperature, preferably 2,000° C. for silicon carbide, above which the desired number of point defects is produced in the manner according to the present invention. Stated differently, the invention includes the step of heating the silicon carbide crystal to the temperature represented by line 10 or higher.

The second highest line is designated at 12 and represents a lower temperature (which will be understood as relative rather than exact, but which in preferred embodiments is about 1200° C.) that together with the upper temperature line 10 defines a temperature range (represented by the arrow 11) within which the states created above the temperature line 10 will be expected to heal if the crystal is allowed to remain in this temperature range for a period of time sufficient to approach an equilibrium or a near equilibrium condition. Accordingly, the invention as described herein minimizes the time that the crystal spends in the temperature range 11 once the increased number of states has been produced. As noted above, maintaining the cooling rate at between about 30° C. and 150° C. per minute is particularly helpful while the crystal is within the temperature range schematically illustrated at 11 in FIG. 1.

The third line designated at 14 represents room temperature (25° C., 298 K) and defines another temperature range (designated by the arrow 13) between room temperature and the temperature line 12. The temperature range symbolized by the arrow 13 represents temperatures that are still above room temperature, but within which the amount of reordering that may occur is statistically insignificant to the semi-insulating characteristics.

For any number of reasons, the crystal normally can be expected to cool all the way to room temperature whether during pre-manufacture, storage, shipping or even use. It will be understood, however, that provided the crystal is heated to a temperature above that represented by the line 10, and then cooled sufficiently rapidly to a temperature below the temperature represented by the line 12, the benefits of the invention will be accomplished, regardless of whether room temperature is ever reached.

Three cooling curves are schematically illustrated as the lines at 15, 16, and 17. Because FIG. 1's abscissa represents time, it will be understood that the line 15 represents the slowest rate of cooling, while the line 17 represents the most rapid. In this sense, the extended curve 15 illustrates that the crystal would spend a much greater period of time in the temperature range designated by the arrow 11 as compared to crystals following the cooling curves designated by the lines at 16 or 17. Thus, the curve 15 schematically represents a prior art approach (intentional or unintentional) to cooling the crystal, while the lines 16 and 17 schematically represent the more rapid cooling steps of the present invention. As noted previously, provided the cooling rate meets the functional aspects described herein, the rate need not be constant.

Figure 2:
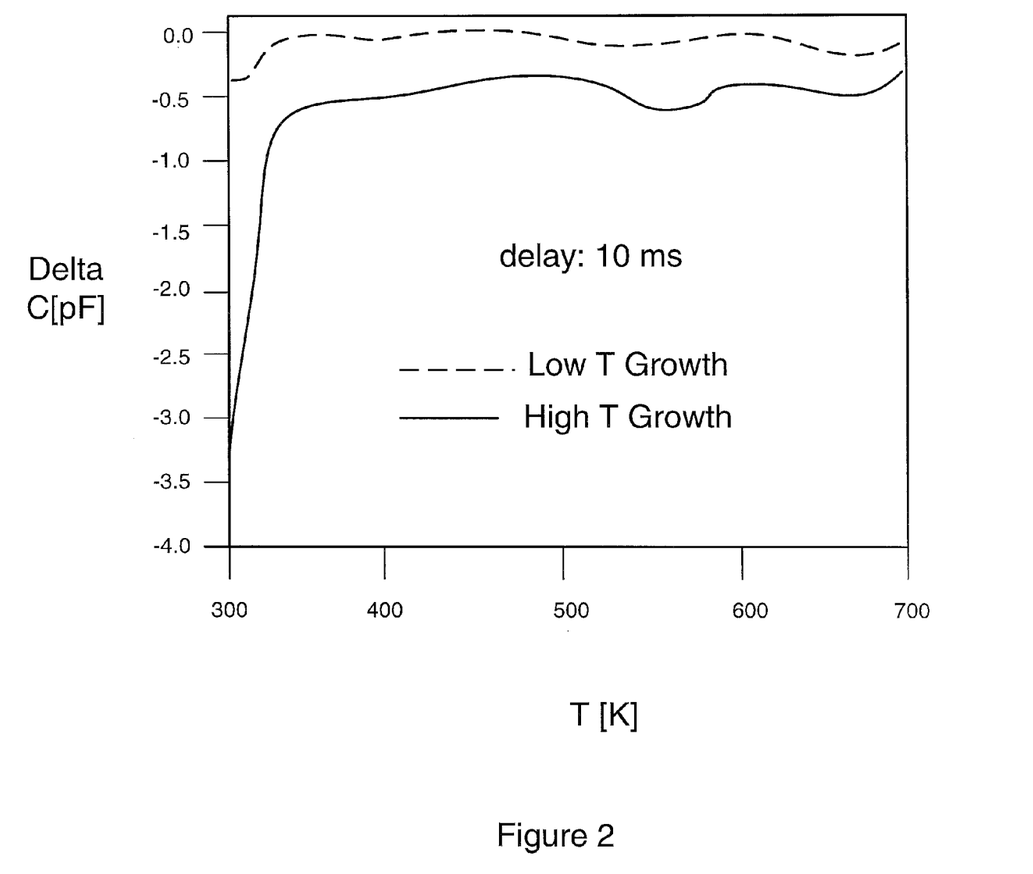
FIG. 2 is a plot of the change in capacitance against temperature in degrees Kelvin as measured by deep level transient spectroscopy (DLTS).

FIG. 2 illustrates that the desired high concentrations of deep-levels correlate with higher growth temperatures. FIG. 2 plots the change in capacitance as measured by deep level transient spectroscopy (DLTS) against temperature. The higher amplitude (e.g. at 300 K) of the crystal samples grown at higher temperatures (solid line) represents a larger concentration of deep levels as compared to a sample grown at a lower temperature (dashed line).

Deep level transient spectroscopy is generally well understood in the semiconductor arts and is a sensitive method used to study deep levels in semiconductors. The method is based on the capacitance charge of a reversed biased diode when deep levels emit their carriers after they have been charged by a forward bias pulse. The emission rate is temperature dependent and characteristic for each type of defect. Using the temperature dependence of the emission rate, the activation energy of a deep level can be determined. See, e.g. ASTM International Test No. F978-02, "Standard Test Method for Characterizing Semiconductor Deep Levels by Transient Capacitance Techniques." Other techniques for evaluating the crystal can include capacitance versus voltage (CV) techniques, as well as electron paramagnetic resonance (EPR).

Figure 3:
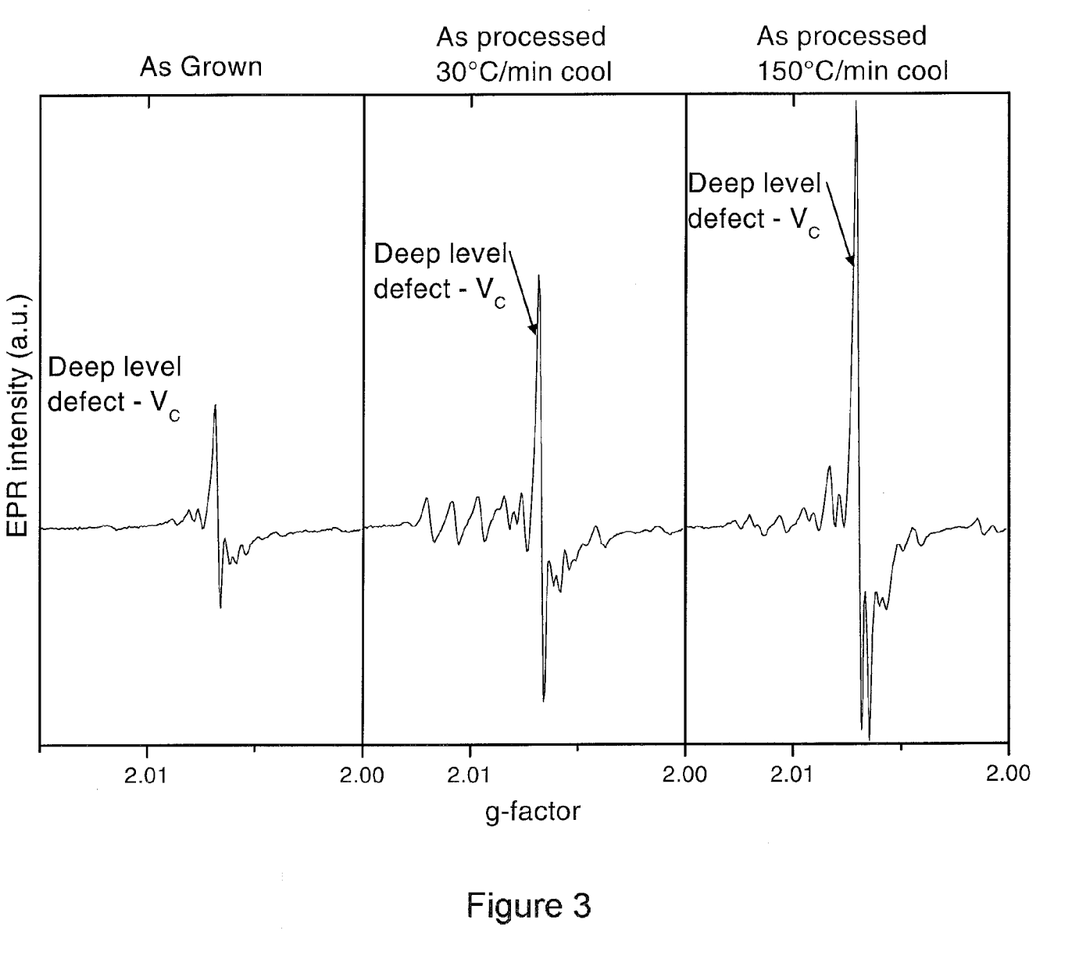
FIG. 3 is a comparative set of three plots from electron paramagnetic resonance (EPR) evaluation of silicon carbide crystal samples.

FIG. 3 is a comparative set of three plots from electron paramagnetic resonance (EPR) evaluation of silicon carbide crystal samples. EPR is a well-understood technique for measuring certain characteristics of materials and is also known as electron spin resonance (ESR) or electron magnetic resonance (EMR). EPR represents the process of resonance absorption of microwave radiation by paramagnetic ions or molecules, with at least one unpaired electron spin and in the presence of a magnetic field. In analyzing crystals according to the present invention, EPR is used to measure the number of charges occupying deep traps in the crystal bandgap. By measuring the change in absorption of microwave energy within a continuously varying strong magnetic field, EPR detects the number of unpaired spins of electronic charges trapped at various defects in the crystal lattice. The EPR measurement does not, however, evict the charges from the traps, but merely detects their presence, thus permitting repeated analysis of the same sample.

The three plots of FIG. 3 represent (from left to right), a silicon carbide crystal grown conventionally, a silicon carbide crystal heated and cooled in the range of 30° C. per minute according to the present invention and a crystal heated and cooled in the range of 150° C. per minute according to the present invention.

Each of the sections of FIG. 3 is sized identically and the magnitude (arbitrary units) of the EPR signal of the carbon vacancy ($V_c$)—i.e. one of the types of point defects that provides the states that in turn provide semi-insulating character—is proportional to the number of defect centers detected by the EPR. As known to those familiar with EPR, the "g-factor" (or "g-value") is characteristic of the type of electron trap and is related to the microwave frequency and the magnetic field strength. Accordingly, given that the sample sizes measured were the same within expected margins of experimental error, the magnitude of the EPR line for the carbon vacancies (from the trough to the peak) is proportional to the concentration of defects in the sample. Thus, FIG. 3 illustrates a significant increase in the number of carbon vacancies (and a resulting improvement in semi-insulating character) from the as-grown condition (left panel) to the process of the invention using a 30° C. rate of cooling (middle panel) to the process of the invention using a 150° C. rate of cooling (right hand panel).

In the drawings and specification there has been set forth a preferred embodiment of the invention, and although specific terms have been employed, they are used in a generic and descriptive sense only and not for purposes of limitation, the scope of the invention being defined in the claims.

That which is claimed is:

1. A semi-insulating silicon carbide crystal having a concentration of point defects higher than a thermodynamic equilibrium concentration of point defects at room temperature made by the method of:
   heating a silicon carbide crystal having a first concentration of point defects to a temperature that thermodynamically increases the concentration of point defects in the crystal; and
   cooling the heated crystal at a sufficiently rapid rate to maintain an increased concentration of point defects in the cooled crystal wherein the increased concentration of point defects is greater than $1\times10^{17}$ cm$^{-3}$.

2. A compensated silicon carbide crystal according to claim 1.

3. A compensated crystal according to claim 2 in which the most concentrated dopant is present in an amount of about 5E16 or less.

4. A semi-insulating silicon carbide crystal made by the method of:
   heating a silicon carbide single crystal to a temperature of at least about 2000° C. to thereby thermodynamically increase the number of point defects and resulting deep level states in the crystal; and
   cooling the heated crystal to approach room temperature at a sufficiently rapid rate to maintain a concentration of point defects in the cooled crystal that remains greater than the first concentration wherein the increased concentration of point defects is greater than $1\times10^{17}$ cm$^{-3}$.

5. A semi-insulating silicon carbide crystal according to claim 4 having a polytype selected from the group consisting of the 3C, 4H, 6H, and 15R polytypes of silicon carbide.

* * * * *